(12) United States Patent
Sawaki et al.

(10) Patent No.: US 6,635,901 B2
(45) Date of Patent: Oct. 21, 2003

(54) SEMICONDUCTOR DEVICE INCLUDING AN INGAAIN LAYER

(75) Inventors: Nobuhiko Sawaki, Chikusanishijutaki, 3-103, 1-6-33, Kitachikusa, Chikusa-ku, Nagoya-shi, Aichi (JP); Yoshio Honda, Mie (JP); Norikatsu Koide, Tenri (JP); Katsuki Furukawa, Sakai (JP)

(73) Assignees: Nobuhiko Sawaki, Nagoya (JP); Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/021,677

(22) Filed: Dec. 12, 2001

(65) Prior Publication Data

US 2002/0074561 A1 Jun. 20, 2002

(30) Foreign Application Priority Data

Dec. 15, 2000  (JP) .......................... 2000-382164
Dec. 15, 2000  (JP) .......................... 2000-382320
Apr. 11, 2001  (JP) .......................... 2001-112821

(51) Int. Cl.$^7$ .................. H01L 31/0336; H01L 31/109; H01L 31/12; H01L 33/00; H01L 31/0312
(52) U.S. Cl. ..................... 257/80; 257/12; 257/13; 257/80; 257/94; 257/98; 257/103; 257/183; 184/613; 184/618; 184/622; 184/623; 184/627; 184/628
(58) Field of Search .................. 257/12–13, 94, 257/98, 183, 184, 613, 618, 622, 623, 627, 628, 103, 80

(56) References Cited

U.S. PATENT DOCUMENTS 5,945,352 A  *  8/1999  Chen et al. .................. 438/713
6,304,587 B1  *  10/2001  Zah .............................. 372/46
6,391,784 B1  *  5/2002  Ibok ............................ 438/702

FOREIGN PATENT DOCUMENTS

JP      05343741      12/1993
JP      08064901       3/1996
JP      10312971      11/1998

* cited by examiner

Primary Examiner—Stephen D. Meier
Assistant Examiner—Ida M. Soward
(74) Attorney, Agent, or Firm—Morrison & Foerster LLP

(57) ABSTRACT

A semiconductor device includes a silicon substrate and a compound semiconductor layer formed on a main plane of the silicon substrate. The compound semiconductor layer is represented by the general formula of $In_xGa_yAl_zN$ (where x+y+z=1, $0 \leq x \leq 1$, $0 \leq y \leq 1$, $0 \leq z \leq 1$). The silicon substrate includes a trench having as a slope a plane inclined 62 degrees from the main plane of the silicon substrate, or a plane inclined in a range within 3 degrees in an arbitrary direction from the inclined plane. The compound semiconductor layer is formed on the slope. The semiconductor device includes compound semiconductor layers represented by $Al_xGa_yIn_zN$ (where x+y+z=1, $0 \leq x \leq 1$, $0 \leq y \leq 1$, $0 \leq z \leq 1$) on a silicon substrate. The silicon substrate has a main plane constituted by a plane in a range of ±5 degrees in an arbitrary direction from a (112) plane. The compound semiconductor layers are formed on the main plane.

10 Claims, 6 Drawing Sheets

SEMICONDUCTOR DEVICE INCLUDING AN INGAAIN LAYER

BACKGROUND OF THE INVENTION

1. Field of the Invention

The present invention relates to a nitride type semiconductor device using a substrate corresponding to a silicon substrate (001) plane rotated 7.3±3 degrees about a [01-1] axis to form by etching a trench portion with a (111) plane of silicon, and effecting crystal growth of a nitride semiconductor film with respect to that trench portion, whereby the semiconductor film has a plane orientation of a (1-101) plane, and a method of fabricating such a substrate. The present invention also relates to a nitride type semiconductor device that has a nitride type semiconductor layer stacked on a silicon substrate having a main plane formed of a plane that is within a range of ±5 degrees from a (112) plane in an arbitrary direction.

2. Description of the Background Art

Using nitride semiconductor material of GaN, InN and AlN and a semiconductor of a mixture thereof, light emitting devices with $In_xGa_{1-x}N$ crystal as a light emitting layer on a sapphire substrate, GaN substrate, SiC substrate or silicon (111) substrate have been produced. Since the Si substrate is particularly superior than the other substrates by the advantage of providing those of a large area and constant quality at low cost, it is expected that a light emitting device can be produced at low cost by using an Si substrate.

Japanese Patent Laying-Open No. 5-343741, for example, discloses a nitride gallium type semiconductor device formed on a silicon (111) substrate.

When a nitride semiconductor is grown using a silicon (111) substrate, a nitride semiconductor film having a C plane as the growth plane can be obtained. However, the planarity of this epitaxial semiconductor film was not so favorable at the atom level.

For example, in the case where an n type clad layer, a quantum well type light emitting layer formed of $In_xGa_{1-x}N$ and a p type clad layer are stacked on such a substrate to produce a semiconductor device of a micro structure, the thickness of the light emitting layer and the In composition are not uniform due to the non-planarity of the film. This unevenness affects the light radiation. Only a semiconductor light emitting device having an emission spectrum of a wide half band width of 40 nm could be obtained. The light output of such a light emitting device was inferior to that obtained from an element on a sapphire substrate or SiC substrate.

In the case where such substrates are employed to produce a GaN type MESFET (Metal Semiconductor Field Effect Transistor) having an electrode of a source, drain and gate formed at a film produced by growing an Si-doped GaN layer through a high resistance layer formed of an AlGaN layer, and furthermore a GaN type MODFET (Modulation Dope Field Effect Transistor) having Si modulation-doped on a GaN channel layer, the abruptness at the channel layer interface is poor due to the low planarity thereof. Therefore, the mobility of the electrons running in the channel layer by the scattering of the asperity was degraded. Therefore, a semiconductor device exhibiting favorable electrical characteristics at the cutoff frequency and the like could not be obtained.

Since a silicon substrate of a large area and of high quality can be obtained at low cost, the usage of a silicon substrate for the fabrication of a nitride type semiconductor device allows a more inexpensive semiconductor device to be obtained as compared to the usage of a conventional substrate.

However, in the case where epitaxial growth is effected to produce a nitride type semiconductor layer on a conventional silicon substrate, it was difficult crystallographically to cut the substrate into a square chip since the silicon substrate has a (111) plane as the main plane. There was a problem that the edge was easily chipped after being cut.

SUMMARY OF THE INVENTION

In view of the foregoing, an object of the present invention is to provide crystal growth of a nitride epitaxial film superior in planarity and of high quality using a silicon substrate in a multilayered structure of a nitride type semiconductor by improving the planarity at the atom level to increase the abruptness and improve the photoelectric property of the device.

Another object of the present invention is to prevent chipping at the end plane by rendering feasible the cutting of a semiconductor device having a layered structure of a nitride type semiconductor layer into chips.

According to an aspect of the present invention, a semiconductor device includes a silicon substrate and a compound semiconductor layer formed on a main plane of the silicon substrate and represented by the general formula of $In_xGa_yAl_zN$ (where x+y+z=1, $0 \leq x \leq 1$, $0 \leq y \leq$, $0 \leq z \leq 1$). The silicon substrate includes a trench having as a slope a plane inclined 62 degrees from the main plane of the silicon substrate or a plane inclined in a range of within 3 degrees from the inclined plane in an arbitrary direction. The compound semiconductor layer is formed on the slope.

According to another aspect of the present invention, a semiconductor device includes a compound semiconductor layer represented by the general formula of $In_xGa_yAl_zN$ (where x+y+z=1, $0 \leq x \leq 1$, $0 \leq y \leq 1$, $0 \leq z \leq 1$). The compound semiconductor layer is formed using a silicon substrate having a main plane constituted by a plane corresponding to a (100) plane rotated 7.3 degrees about a [01-1] axis, or a plane in a range inclined within 3 degrees in an arbitrary direction from the rotated plane. The silicon substrate includes a trench having a (111) plane as a slope. The compound semiconductor layer is formed on the slope.

The <0001> direction of the compound semiconductor layer is substantially perpendicular to the slope. The compound semiconductor layer has a (1-101) plane as the plane orientation. Having the (1-101) plane as the plane orientation indicates that the plane orientation of the main plane of the compound semiconductor layer is substantially the (1-101) plane.

The semiconductor device is a semiconductor light emitting device having a light emitting layer (active layer). The compound semiconductor layer includes the light emitting layer (active layer). The light emitting layer (active layer) has a (1-101) plane as the plane orientation.

According to a further aspect of the present invention, a method of fabricating a semiconductor device includes the steps of forming at a main plane of a silicon substrate a trench having as a slope a plane inclined 62 degrees from the main plane or a plane inclined in the range within 3 degrees from the inclined plane in an arbitrary direction, and forming a compound semiconductor layer represented by the general formula of $In_xGa_yAl_zN$ (where x+y+z=1, $0 \leq x \leq 1$, $0 \leq y \leq 1$, $0 \leq z \leq 1$) on the slope.

According to still another aspect of the present invention, a method of fabricating a semiconductor device includes the steps of forming a trench having a (111) plane as a slope at a main plane of a silicon substrate that has a main plane constituted by a plane corresponding to a (100) plane rotated 7.3 degrees about a [01-1] axis or a plane in a range inclined within 3 degrees from the rotated plane in an arbitrary direction, and forming a compound semiconductor layer represented by the general formula of $Al_xGa_yIn_zN$ (where x+y+z=1, $0 \leq x \leq 1$, $0 \leq y \leq 1$, $0z \leq 1$) on the slope.

A plurality of the above-described trenches are formed on the Si substrate. The compound semiconductor layer formed on the slope of each trench may be combined according to the crystal growth.

The fabrication method of a semiconductor device of the present invention can include the step of removing the silicon substrate after the compound semiconductor layer is formed.

A fabrication method of a semiconductor substrate of the present invention includes the steps of forming at a main plane of a silicon substrate a plurality of trenches having as a slope a plane inclined 62 degrees from the main plane or a plane inclined in a range within 3 degrees from the inclined plane in an arbitrary direction, forming a compound semiconductor crystal represented by the general formula of $In_xGa_yAl_zN$ (where x+y+z=1, $0 \leq x \leq 1$, $0 \leq y \leq 1$, $0 \leq z \leq 1$) on the slope, further growing the compound semiconductor crystal formed on the slope of each trench to combine, whereby a compound semiconductor crystal of a continuous film is obtained, and removing the silicon substrate after the compound semiconductor crystal film is obtained to produce a semiconductor substrate formed of the compound semiconductor crystal.

GaN is a crystal of potent orientation. In the general method, a c axis is oriented perpendicular to the main plane. Therefore, the obtained crystal has the C plane as the main plane. It was difficult to obtain a crystal having a plane differing from the C plane.

The inventors of the present invention carried out various experiments to find out that, by applying a mask of $SiO_2$ partially on a substrate corresponding to a silicon substrate (001) plane rotated 7.3 degrees about a [01-1] axis or a plane inclined in the range of within 3 degrees from the rotated plane in an arbitrary direction, and etching away the open portion without the $SiO_2$ mask to form a trench having a (111) facet in the relationship of 62 degrees from the off oriented substrate (main plane) and growing a nitride type semiconductor film epitaxially at that plane, growing is effected with a (1-101) facet of the GaN type semiconductor as the growth plane.

This facet is extremely superior in planarity. By effecting growth using this substrate, a nitride semiconductor film of high planarity at the atom level is obtained.

Furthermore, by inclining the c axis of the GaN film, the difference in the thermal expansion coefficient between the silicon substrate and this substrate is reduced to suppress the occurrence of cracking.

When the (1-101) facet is employed as the growth plane of the semiconductor light emitting device, the electric field generated by the piezo effect at the interface of the well in the active layer and the barrier layer is reduced by inclining the c axis. Therefore, the carrier recombination of the electron-hole pair is improved to result in a higher light emitting efficiency.

A semiconductor light emitting device formed of an AlGaInN type nitride semiconductor was produced on the above-described semiconductor film. The characteristics of the semiconductor light emitting device were measured. Since the planarity is extremely high even at the active layer and the variation in the layer thickness is small, a semiconductor light emitting device having an emission spectrum of a narrow half band width of 15 nm could be obtained.

According to yet a further aspect of the present invention, a semiconductor device includes a compound semiconductor layer represented by $In_xGa_yAl_zN$ (where x+y+z=1, $0 \leq x \leq 1$, $0y \leq 1$, $0 \leq z \leq 1$) on a silicon substrate. The silicon substrate has a main plane constituted by a plane in a range of ±5 degrees from a (112) plane in an arbitrary direction. The compound semiconductor layer is provided on this main plane. The compound semiconductor layer is preferably formed on the main plane with an intermediate layer there between.

According to yet a further aspect of the present invention, a semiconductor device includes a silicon substrate having a main plane in a range of ±5 degrees in an arbitrary direction from a (112) plane, a compound semiconductor layer represented by $In_xGa_yAl_zN$ (where x+y+z=1, $0 \leq x \leq 1$, $0 \leq y \leq 1$, $0 \leq z \leq 1$) layered on the main plane, a first electrode formed on the compound semiconductor layer, and a second electrode formed at a back side of the silicon substrate.

The inventors carried out experiments taking into consideration the issues set forth below to conceive of the usage of a silicon (112) plane substrate that has a (112) plane as the main plane. The division of a wafer into chips is facilitated when the side planes in the two directions of a square chip has the minimum numbers of silicon bonds in the atomic arrangement of the silicon plane and the silicon atoms are arranged uniformly at that plane without the arrangement of other silicon atoms. A flat epitaxial layer is required using such a plane.

The inventors confirmed that the silicon substrate could be easily cut in the two-axis directions of <11-2> and <1-10> when a silicon (112) plane substrate with the (112) plane as the main plane was used. Furthermore, a flat nitride type semiconductor layer could be formed on the main plane by the usage of an intermediate layer (buffer layer).

By stacking an AlGaInN type nitride semiconductor layer on the nitride type semiconductor layer to produce a semiconductor device, the semiconductor device exhibited higher light radiation intensity as compared to the conventional one. By carrying out scribing in the cutting operation into chips, a square semiconductor device chip with no chipping is obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
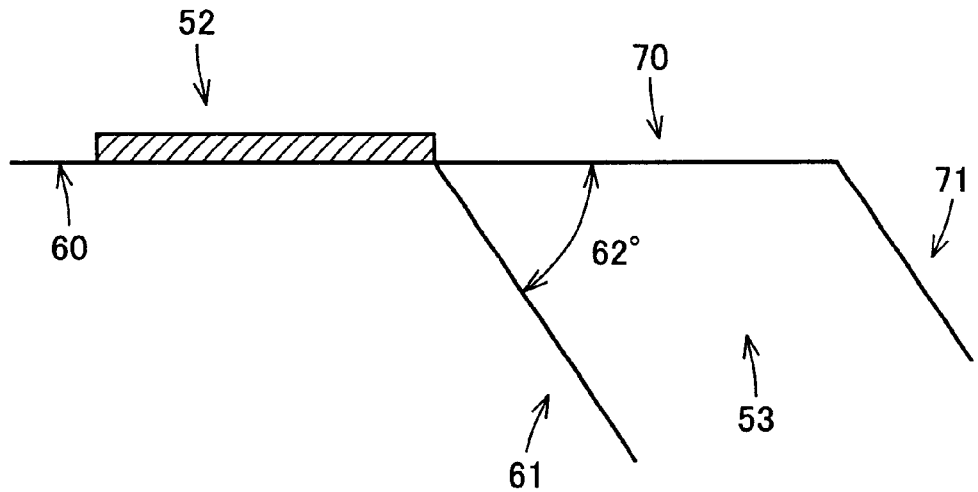
FIG. 1 is a schematic diagram to describe the formation of a (1-101) facet of a nitride semiconductor film.
Figure 2:
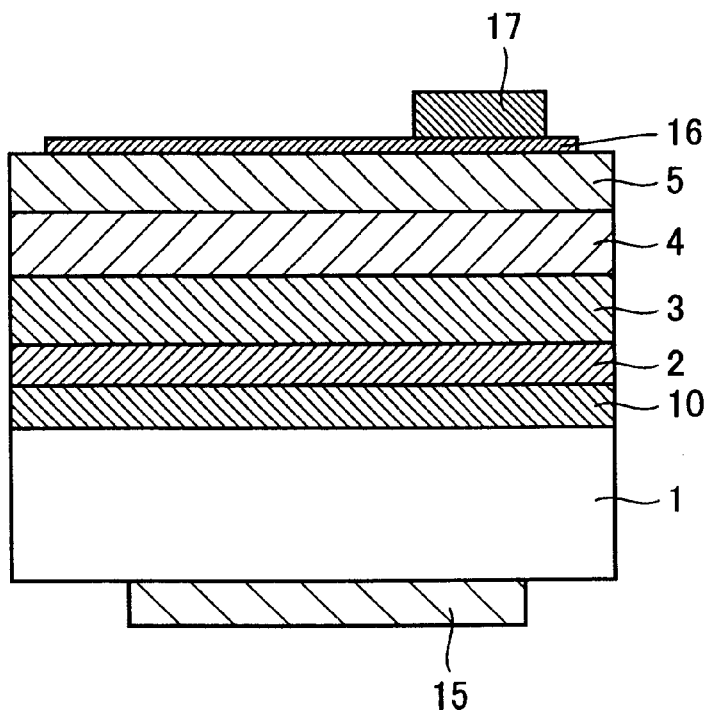
FIG. 2 is a sectional view of a light emitting device according to an embodiment of the present invention.

Embodiments of the present invention will be described hereinafter with reference to the drawings.
First Embodiment FIG. 1 is a schematic diagram to describe formation of a (1-101) facet 70 of a nitride semiconductor film of the present embodiment. FIG. 2 is a schematic cross sectional view of a structure of the present nitride semiconductor light emitting device.

According to a nitride semiconductor light emitting device of the present embodiment, a mask 52 of $SiO_2$ is applied partially on a (001) Si off-oriented substrate 1 having a main plane inclined 7.3° to the [0-1-1] direction. The portion not masked with $SiO_2$ 52 is etched to form a trench having a (111) facet 61 in a relationship of 62 degrees from off oriented substrate (main plane) 60. Upon facet 61 are sequentially stacked in a planarized manner an n-AlGaInN layer 10, a first clad layer 2 formed of n-GaInN, a light emitting layer 3 formed of $In_xGa_{1-x}N$, a carrier block layer 4 formed of p-AlGaInN, and a second clad layer 5 formed of p-GaInN. Furthermore, an electrode 15 is formed at the back side of silicon substrate 1. A transparent electrode 16 is formed at a top plane of second clad layer 5. A bonding electrode 17 is provided on a portion of transparent electrode 16. In FIG. 2, the structure of $SiO_2$ mask 52, the trench and the like are not depicted.

The light emitting layer of $In_xGa_{1-x}N$ can emit light from ultraviolet to red in the wavelength by altering the composition x of $In_xGa_{1-x}N$. In the present embodiment, the light emitting layer emits blue light with the composition of the solid phase of Ga as X=0.82. The resistance of second clad layer 5 of the p conductivity type doped with magnesium is high. Therefore, there is a possibility that the current density will not be uniform throughout light emitting layer 3 even if current, i.e., holes, are introduced to one end of second clad layer 5 from just bonding electrode 17. On account of this possibility, a thin film transparent electrode 16 is provided between electrode 17 and second clad layer 5, substantially all over second clad layer 5. Accordingly, more light can be output from this portion. Metal is to be employed for electrode 15 connected on the n conductivity type silicon substrate. It is desirable that this metal includes any of Al, Ti, Zr, Hf, V, and Nb. A metal of not more than 20 nm in thickness is to be employed for transparent electrode 16 connected to second clad layer 5 of the p conductivity type formed of GaN. It is desirable that this metal includes any of Ta, Co, Rh, Ni, Pd, Pt, Cu, Ag, Au.

A method of the fabricating a light emitting device of the present embodiment will be described with reference to FIG. 1.

On a rinsed silicon substrate is deposited a silicon oxide film or silicon nitride film 52 to a thickness of 100 nm by sputtering or CVD. Then, photolithography is applied to partially remove the silicon oxide film or silicon nitride film in stripes. The wafer is subjected to acid etching or the like by a buffered hydrofluoric acid to form a trench having an Si (111) facet 61. The trench is provided in stripes extending in the Si [01-1] direction. As shown in FIG. 1, (111) facet 61 has a relationship of 62 degrees from main plane 60 of silicon substrate 1 due to the aforementioned plane orientation. This plane can be easily formed by appropriately adjusting the temperature of the acid etchant and the etching rate well known in the field of art. This plane can also be formed easily by using an alkaline etchant such as KOH. In order to carry out crystal growth with priority from the predetermined (111) facet 61 on the trench and Si substrate surface, the remaining area not related to crystal growth is preferably masked with a material such as silicon nitride or silicon oxide that suppresses growth of the nitride semiconductor thereon.

Then, a nitride semiconductor film is grown under the growth conditions set forth below on the substrate by MOCVD (metal organic chemical vapor deposition).

Figure 3:
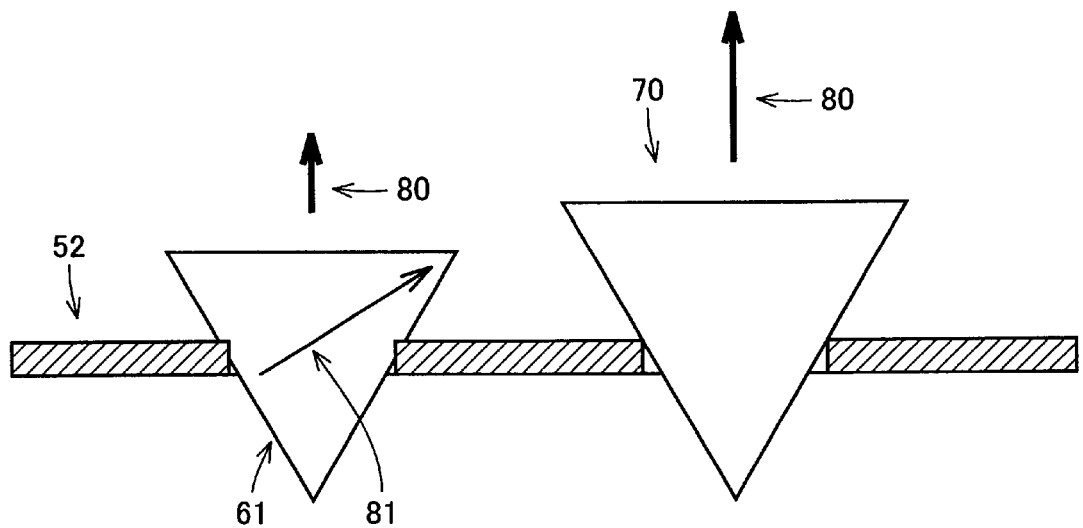
FIG. 3 shows the relationship of the substrate nitride semiconductor film employed in the present invention.

In the case where the present substrate is used, crystal growth proceeds with the axis perpendicular to facet plane 61 having a relationship of 62 degrees from the silicon substrate as the c axis of the nitride semiconductor film, as shown in FIG. 3. A nitride semiconductor film is formed with the (1-101) facet as a plane 70.

The silicon substrate employed here has a main plane 60 that is inclined 7.3° in the [0-1-1) direction from the (001) plane, i.e. rotated 7.3° about the [01-1] axis from the (001) plane, whereby plane 70 will have a plane orientation substantially identical to that of main plane 60 of the silicon substrate. An extremely planar GaN plane that substantially has a (1-101) plane is obtained even in the case of a plane inclined in the range of within 3 degrees from this plane in an arbitrary direction. A structure can be provided wherein a nitride semiconductor film is grown only on the trench as shown in FIG. 1 to continuously form a light emitting device on (1-101) facet 70 of the nitride semiconductor film. When the growth of the nitride semiconductor film is further continued so that crystal growth proceeds gradually as shown from the left illustration to the right illustration in FIG. 3, a semiconductor light emitting device can be provided on the continuous film. In the present embodiment, an element is formed on a continuous film obtained in this manner.

A silicon substrate 1 having a trench formed by the above-described process is introduced into a MOCVD apparatus. In a hydrogen ($H_2$) atmosphere, cleaning is effected at the high temperature of approximately 1100° C.

Then, at 800° C., $NH_3$, trimethyl aluminum (TMA), trimethyl indium (TMI), and $SiH_4$ (silane) gas are introduced at 5 l/min., 10 $\mu$mol/min., 17 $\mu$mol/min., 0.1 $\mu$mol/min., respectively, while introducing $N_2$ at 10 l/min. as carrier gas to grow a silicon doped $Al_{0.85}In_{0.15}N$ layer 10 having a thickness of approximately 10 nm.

Then, at the same temperature, supply of TMA is stopped. Trimethyl gallium (TMG), TMI, and $SiH_4$ (silane) gases are introduced at approximately 20 $\mu$mol/min., 100 $\mu$mol/min., 0.05 $\mu$mol/min., respectively, to grow a first clad layer 2 of silicon doped $Ga_{0.92}In_{0.08}N$ to a thickness of approximately 3 micron.

Accordingly, the trench portion is filled and adjacent first clad layers 2 of $Ga_{0.92}In_{0.08}N$ are combined to form first clad layer 2 of $Ga_{0.92}In_{0.08}N$ having a flat (1-101) plane 70 on the Si substrate.

Following deposition of an intermediate layer 10 of AlInN, the growth temperature for first clad layer 2 can be increased to result in a GaN film. Alternatively, by using a GaInN clad layer that includes In and does not include Al, growth at low temperature is allowed without having to raise the growth temperature to a high temperature. By carrying out the growth at low temperature, there are fewer generations of cracks.

Then, supply of TMA, TMI and TMG is stopped. The temperature of the substrate is lowered to 760° C. Trimethyl indium (TMI) that is the indium material is introduced at 6.5 $\mu$mol/min., and TMG is introduced at 2.8 $\mu$mol/min., whereby a well layer of $In_{0.18}Ga_{0.82}N$ is grown to the thickness of 3 nm. Then, the temperature is raised again up to 850° C., and TMG is introduced at 14 μmol/min. to grow a barrier layer of GaN. In a similar manner, the growth of the well layer and the barrier layer is repeated to produce a light emitting layer 3 of a multiple quantum well (MQW) of 4 pairs.

Following the completion of the growth of the light emitting layer, TMG, TMA, TMI, and biscyclo pentadienyl magnesium ($Cp_2Mg$) which is a p type doping source gas are introduced at 11 μmol/min., 1.1 μmol/min., 40 μmol/min. and 10 μmol/min., respectively, at a temperature identical to that of the last barrier layer to grow a p type carrier block layer 4 of $Al_{0.20}Ga_{0.75}In_{0.05}N$ to a thickness of 50 nm. At the end of the growth of carrier block layer 4, supply of TMA is stopped, and p type second clad layer 5 of $Ga_{0.9}In_{0.1}N$ is grown to a thickness of 80 nm at the same growth temperature. This completes the growth of the light emitting device structure. When the growth ends, supply of TMG, TMI and $Cp_2Mg$ is stopped and the temperature is lowered to room temperature. The light emitting device structure is output from the MOCVD apparatus. Then, a transparent electrode 16 is formed at the top surface of the second clad layer formed of p type $Ga_{0.9}In_{0.1}N$. Then, bonding electrode 17 is formed on a portion of transparent electrode 16. Electrode 15 is formed at the bottom plane of the Si substrate. Thus, the light emitting device of the present embodiment is completed.

The characteristics of the produced semiconductor device were measured. The active layer thereof exhibited extremely high planarity and variation in the layer thickness was small. A semiconductor light emitting device having a narrow half band width of 15 nm in the emission spectrum is obtained. Furthermore, the intensity of the emitted light was at least 10 times that of an element formed on a conventional Si (111) substrate.

Second Embodiment

In the previous first embodiment, a light emitting device structure is formed directly on a silicon substrate inclined 7.3 degrees from the (001) plane. By using this off-oriented silicon substrate as an underlayer substrate to produce a GaN substrate and then removing the silicon, a planer GaN substrate can be obtained, which can be used for the production of a semiconductor device.

GaN is grown with an AlN intermediate layer on the Si off-oriented substrate by MOCVD. This intermediate layer may be substituted with an intermediate layer of AlInN, AlGaN to obtain a similar result.

This substrate is introduced into a HVPE (hydride VPE) apparatus. The temperature of the substrate is raised up to approximately 1050° C. while introducing $N_2$ carrier gas and $NH_3$ respectively at 5 l/min. Then, GaCl is introduced 100 cc/min. on the substrate to initiate growth of a GaN thick film. GaCl is produced by conducting HCl gas to the Ga metal maintained at approximately 850° C. Also, by introducing impurity gas using an impurity doping line that is arranged individually to the proximity of the substrate, impurities can be doped arbitrarily during the growing step. For the purpose of doping Si in the present embodiment, monosilane ($SiH_4$) is supplied 200 mol/min. (Si impurity concentration approximately $3.8 \times 10^{18}$ cm$^{-3}$) at the same time the growing step is initiated to form an Si doped GaN film.

The above-described growing step is carried out 8 hours to produce GaN having a total film thickness of approximately 350 μm on the Si substrate. Following the growing step, the Si substrate is removed by grinding or etching to obtain an extremely planar GaN substrate having a (1-101) plane. Thus, a GaN substrate having a (1-101) plane at the surface can be obtained.

This GaN substrate is rinsed and introduced in to a MOCVD equipment. The substrate temperature is raised up to 760° C., and trimethyl indium (TMI) which is the indium source and TMG are introduced at 6.5 μmol/min. and 2.8 μmol/min. respectively, to form a well layer of $In_{0.18}Ga_{0.72}N$ to a thickness of 3 nm on the GaN substrate. Then, the temperature is raised to 850° C., and TMG is introduced 14 μmol/min. to grow a barrier layer of GaN. In a similar manner, the growth of the well layer and barrier layer is repeated to form a light emitting layer 3 of a multiple quantum well (MQW) including 4 pairs.

Following the completion of the growing step of the light emitting layer, TMG, TMA, TMI, and biscyclo pentadienyl magnesium ($Cp_2Mg$) which is a p type doping source gas are introduced at 11 μmol/min., 1.1 μmol/min., 40 μmol/min. and 10 μmol/min. respectively, at a temperature identical to that of the last barrier layer to grow p type carrier block layer 4 of $Al_{0.20}Ga_{0.75}In_{0.05}N$ to a thickness of 50 nm. When the growth of carrier block layer 4 ends, the supply of TMA is stopped, and p type second clad layer 50 of $Ga_{0.9}In_{0.1}N$ is grown to a thickness of 80 nm at the same growth temperature. This completes the growth of the light emitting device structure. When the growing step ends, supply of TMG, TMI and $Cp_2Mg$ is stopped, and the temperature is lowered to room temperature. The light emitting device structure is output from the MOCVD equipment. Then, a p type transparent electrode 16 is formed at the top surface of the second clad layer which is a $Ga_{0.9}In_{0.1}N$ layer. Then, bonding electrode 17 is formed on a portion of transparent electrode 16. Electrode 15 is formed at the back side plane of the GaN substrate. Thus, a light emitting device of the present embodiment is produced.

Using an Si substrate as a starting substrate, an extremely planer GaN substrate is produced having a (1-101) plane 70. By producing a semiconductor device using this planar GaN substrate, a semiconductor light emitting device having a narrow half band width of 15 nm in the emission spectrum is obtained. The intensity of the emitted light of the obtained light emitting device is more than three times that of the device of the first embodiment.

Third Embodiment

In the previous first embodiment, a light emitting device structure was produced by vapor deposition employing organic metal on a silicon substrate inclined 7.3 degrees from the (001) plane. A light emitting device can be produced by a growth step using molecular beam epitaxy (MBE). In the present embodiment, the MOCVD growing step of the first embodiment is altered to the MBE growing step set forth below.

The metals of Ga, Al, and In are employed as the sources of Ga, Al, and In. As the source of N, $NH_3$ is employed.

A rinsed silicon substrate 1 is introduced into a MBE equipment. Cleaning is effected at the high temperature of approximately 1100° C. in high vacuum.

Then, $NH_3$ and metals Al and In are introduced at 800° C. to grow an $Al_{0.85}In_{0.15}N$ layer 10 to a thickness of approximately 20 nm.

Then, the supply of metal Al is stopped, and metals Ga and In are introduced at the same temperature to grow first clad layer 2 of silicon doped $Ga_{0.92}In_{0.08}N$ to a thickness of approximately 300 nm.

Then, the supply of Ga, Al and In is stopped, and the substrate temperature is lowered down to 760° C. to grow a light emitting layer 3 of a multiple quantum well (MQW).

Following the end of the growth of the light emitting layer, metals Ga, Al and In, and MG which is the p type doping source gas are introduced at a temperature identical to that of the last barrier layer to grow a p type $Al_{0.20}Ga_{0.75}In_{0.05}N$ carrier block layer 4 to a thickness of 50 nm. When the growth of carrier block layer 4 ends, supply of metal Al is stopped, and p type $Ga_{0.9}In_{0.1}N$ second clad layer 5 is grown to the thickness of 80 nm at the same growth temperature. Thus, the growing step of the light emitting device structure ends. Following the above-described MBE, transparent electrode 16 is formed at the upper plane of the p type second clad layer of $Ga_{0.9}In_{0.1}N$. Then, bonding electrode 17 is formed at a portion of transparent electrode 16. Electrode 15 is formed at the bottom plane of the Si substrate. Thus, the light emitting device of the present embodiment is completed.

Fourth Embodiment

In the previous first embodiment, a trench slope inclined approximately 62 degrees from the silicon main plane was obtained taking advantage of the feature that the Si (111) plane is readily formed by etching (wet etching) using an etchant. The obtained slope is the so-called crystal facet, stable in working accuracy as well as superior in planarity. It is favorable as an underlayer on which a nitride semiconductor is grown. The application range of the present invention is not limited thereto. The inventors carried out various experiments so as to form an inclined trench that is 62 degrees from the main plane, instead of using a silicon substrate inclined 7.3 degrees from the (001) plane as the main plane, by applying a mask 52 partially to another plane similar to the silicon plane in the first embodiment, and altering the etching temperature and rate.

A similar result was obtained by using such a plane. In other words similar to the first embodiment, crystal growth can be carried out so that the GaN (1-101) plane is substantially parallel to the substrate main plane. By continuing this growth, a continuous crystal film with a planar GaN (1-101) plane at the surface can be obtained. GaN is a crystal of potent orientation. In general, the c axis is oriented perpendicular to the main plane. Therefore, the obtained crystal had the C plane as the main plane. It was conventionally difficult to obtain a crystal having a plane differing from the C plane. According to the present invention, a crystal having a GaN (1-101) plane as the main plane can be easily obtained.

Fifth Embodiment

A method of a fabricating a semiconductor device of the present invention will be described in further detail.

Figure 4:
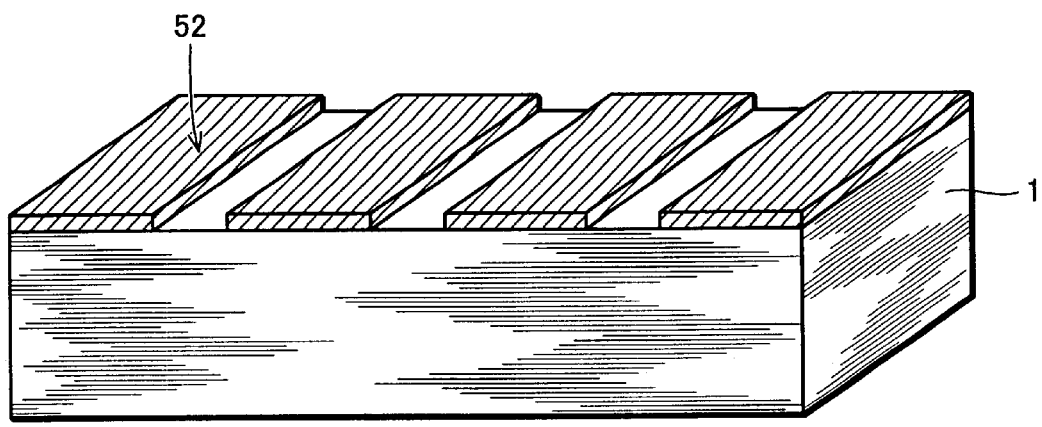
FIGS. 4–7D are diagrams to describe a fabrication method of a compound semiconductor of the present invention.
Figure 5:
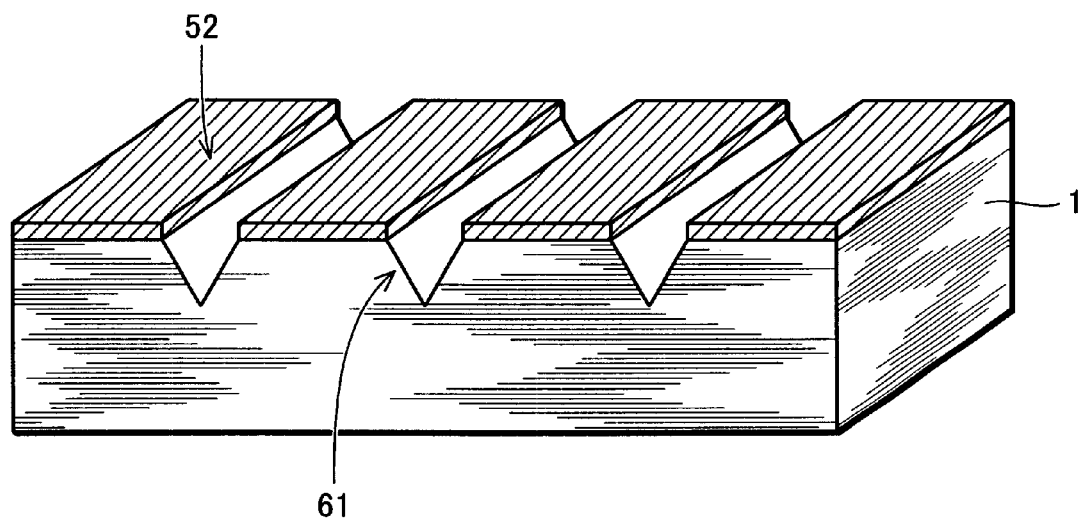
Figure 6:
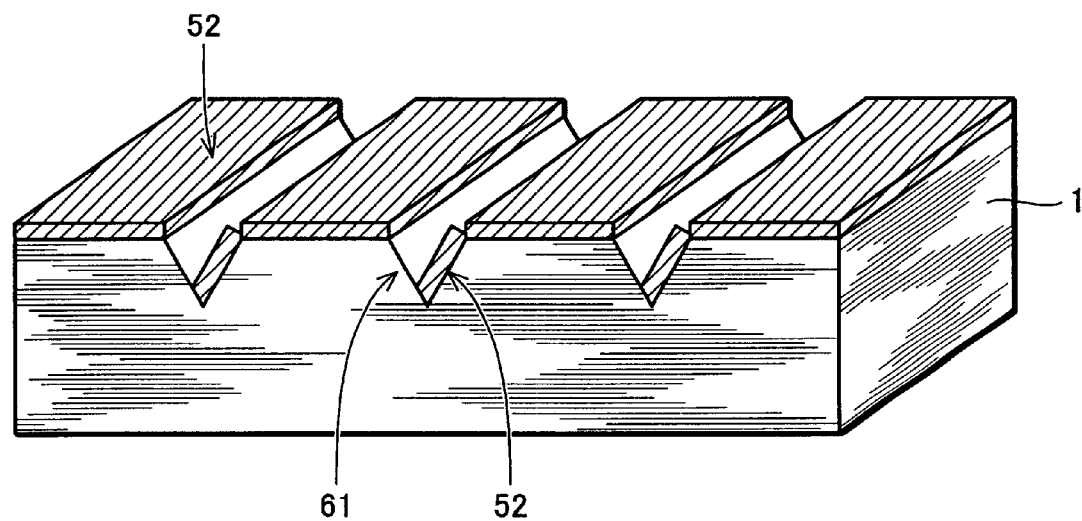

Referring to FIG. 4, a 100 nm-thick mask 52 of a silicon oxide film or silicon nitride film for facet formation is formed in the pattern of stripes extending in the Si [01-1] direction by means of film deposition such as sputtering and also photolithography on a silicon substrate inclined 7.3° in the [0-1-1] direction from the (001) plane. Referring to FIG. 5, a trench having a (111) facet 61 as a slope is formed by etching using a diluted KOH solution. The configuration of the trench is V-shaped or a modification of the V-shape with a flat bottom region. One of the slopes of the trench becomes a (1-1-1) facet. Since the silicon substrate is an off-oriented substrate, the configuration of the V-shape is not symmetrical. The (111) plane is a plane inclined approximately 62° with respect to the substrate main plane whereas the (1-1-1) slope is a plane inclined approximately 47° with respect to the substrate main plane. The substrate is placed in the sputtering apparatus in an inclined state to grow a film with no film grown on (111) facet 61. Mask 52 of a silicon oxide film or silicon nitride film is applied so as to also cover the (1-1-1) facet, as shown in FIG. 6. This structure is employed as the substrate for producing a nitride semiconductor film. FIGS. 8A–8D show the orientation relationship of the Si substrate, the facet, and the like.

Figure 7A:
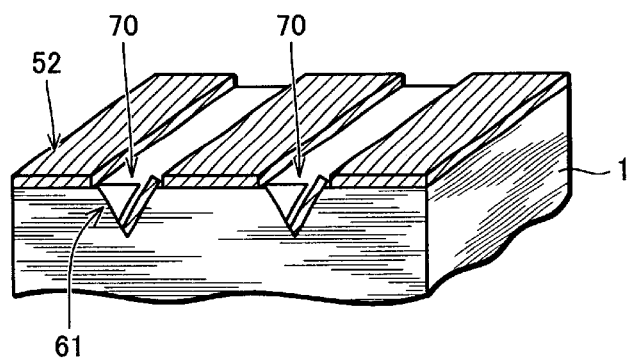
Figure 7B:
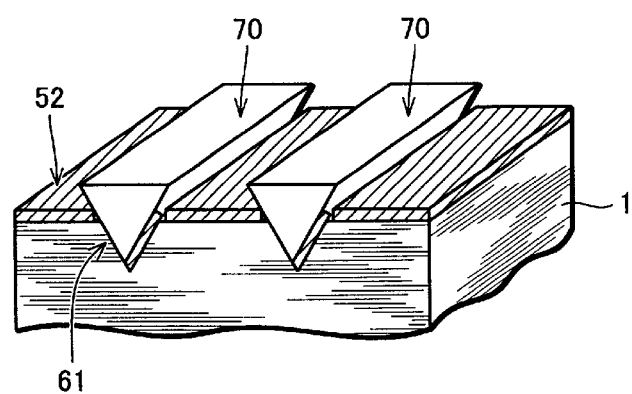
Figure 7C:
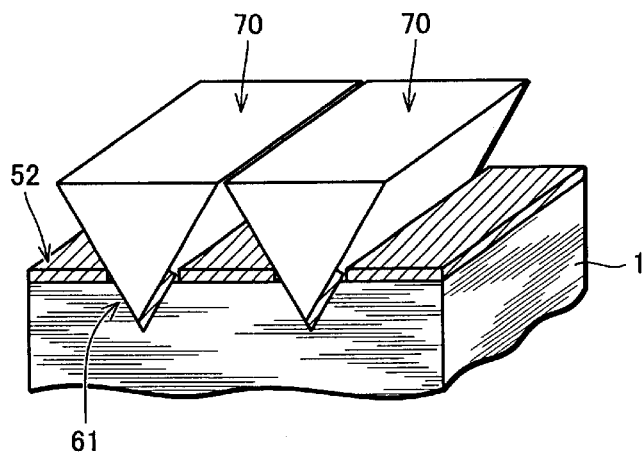
Figure 7D:
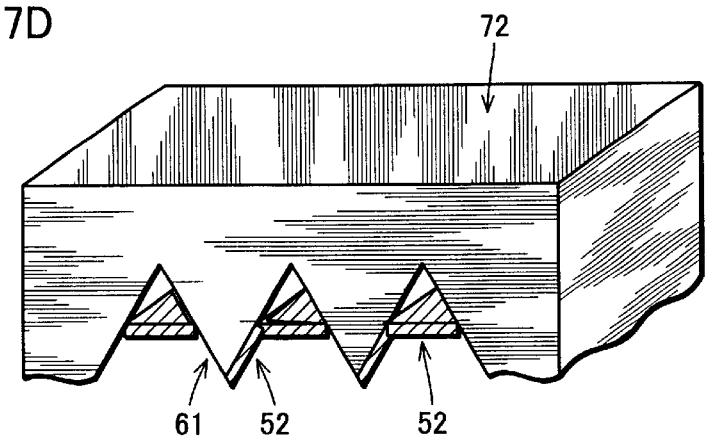
Figure 8A:
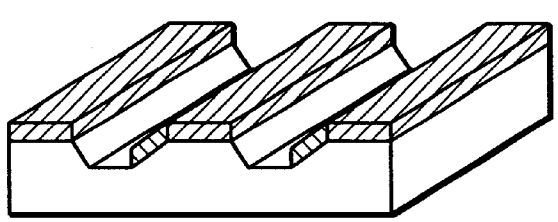
FIGS. 8A–8D are diagrams to describe the crystal orientation relationship in an Si substrate according to a fifth embodiment.
Figure 8B:
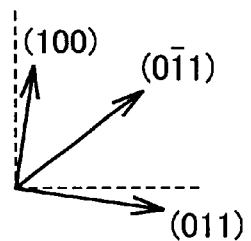
Figure 8C:
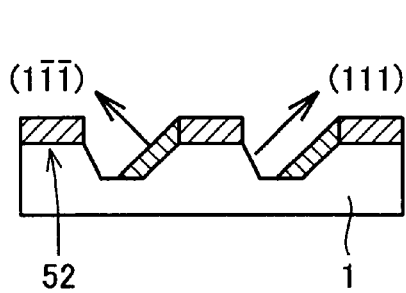
Figure 8D:
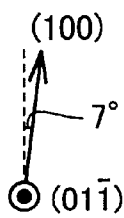

A growing step by MOCVD is applied on the processed Si substrate. An AlInN intermediate layer is grown on the Si off oriented substrate, followed by the growth of GaN. Through the growth process shown in FIGS. 7A–7D, a continuous GaN substrate can be produced. Crystal growth starts from the (111) facet (FIG. 8A). The growing nitride semiconductor has the <0001> orientation located perpendicular to the slope. At the surface of the grown crystal, a GaN (1-101) plane appears substantially parallel to the substrate main plane. Therefore during the growth process, the crystal takes the shape of a triangular prism extending in the direction of the stripes (FIG. 7B). The diameter of the triangular prism becomes larger as the growth proceeds. Eventually, adjacent crystals of the triangular prism shape form contact with each other (FIG. 7C). By continuing this growing process, each separated crystal of the triangular prism combine to result in a GaN crystal film having a planar GaN (1-101) plane at the surface (FIG. 7D).

With regards to the intermediate layer employed at the early stage of the growth process, a similar result can be obtained by using an intermediate layer of AlInN, AlGaN and AlGaInN.

Here, the (111) facet is employed as a slope inclined 62° from the main plane using the above-described (001) plane off-oriented silicon substrate. By controlling the etchant concentration of KOH and the temperature, an Si facet of (211) can be produced instead of (111). In this case, on a silicon substrate inclined 8.6° from the (2-1-1) plane in the [100] direction, trenches in stripes extending in the [01-1] direction are produced to form a slope having a (211) facet inclined 62° from the main plane. This can be employed to obtain a GaN crystal film that has a similar flat surface.

It is considered that the nitride semiconductor crystal is grown with the perpendicular axis to the (211) facet as the c axis. By employing an Si off-oriented substrate that is angled 62° from the (211) plane, a similar planar GaN substrate is obtained.

In the present invention, the usage of an Si substrate facilitates crystal growth in the c axis orientation of the nitride semiconductor film with respect to the substrate. The usage of a substrate that is angled 62° of the facet allows the usage of a crystal film having the (1-101) facet of a planar nitride semiconductor.

By forming a semiconductor light emitting device as shown in FIG. 2 in a manner similar to that of the first embodiment on a continuous nitride semiconductor film obtained as described above, a semiconductor light emitting device of high luminance can be produced on the Si substrate. In the semiconductor light emitting device thus obtained, the light emitting layer (active layer) has the (1-101) plane as the main plane. This differs from the conventional case where the device formed using a sapphire substrate, a SiC substrate or a Si (111) substrate has (0001) as the main plane. A thin film with the (0001) of the nitride semiconductor which is a wurtzite structure as the main plane is equivalent in the band structure in the direction parallel to the main plane. However, a thin film that has the (1-101) plane as the main plane such as in the present invention is not equivalent in the band structure even in the direction parallel to the main plane. Therefore, a light emitting device to which the present invention is applied has the degeneracy of the energy band resolved in the direction parallel to the light emitting layer (active layer). Therefore, high light emitting efficiency can be realized. Also, a significantly low threshold value can be realized in the application to a semiconductor laser device.

Sixth Embodiment

Figure 9:
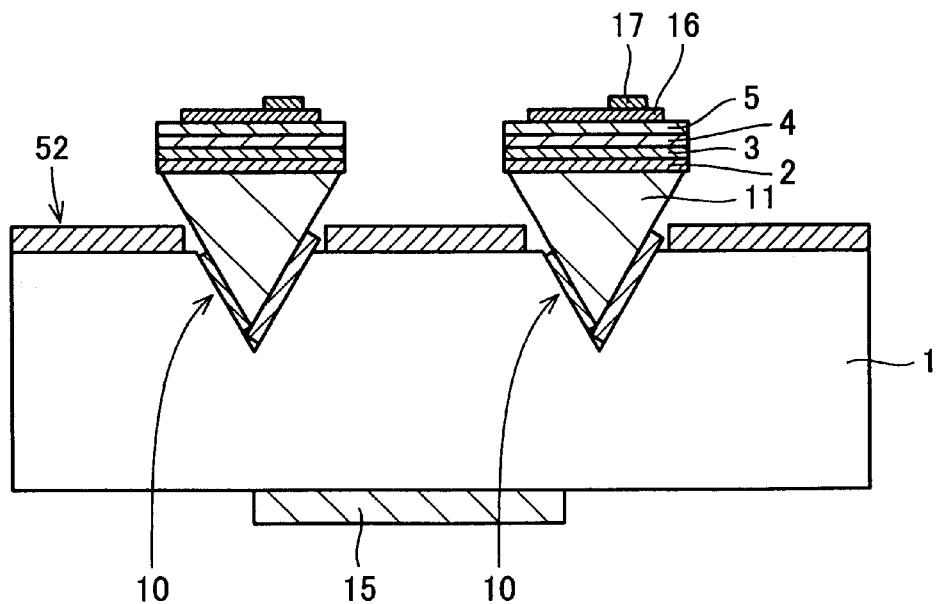
FIG. 9 is a sectional view showing a semiconductor light emitting device of a sixth embodiment.

In the previous fifth embodiment, a continuous nitride semiconductor film was formed through the growing process up to the step shown in FIG. 7D, and a semiconductor light emitting device was produced thereon. In the present sixth embodiment, the crystal growth of each nitride semiconductor layer is ended at the process of FIG. 7B from the step of FIG. 7A, i.e., at the state where each crystal of the triangular prism shape do not combine with each other. As shown in FIG. 9, a semiconductor light emitting device is formed separately at each crystal of the triangular prism to allow each light emitting device to emit radiation.

The device has a multilayered structure of an n-AlGaInN intermediate layer 10, an n-GaN underlying layer 11, a first clad layer 2 of n-GaInN, a light emitting layer 3 of $In_xGa_{1-x}N$, a carrier block layer 4 of p-AlGaInN, and a second clad layer 5 of p-GaInN sequentially stacked on facet 61 formed on the Si substrate. Electrode 15 is provided at the bottom plane of the silicon substrate. A transparent electrode 16 is provided at a top surface of second clad layer 5. A bonding electrode 17 is provided on a portion of transparent electrode 16.

Seventh Embodiment

Figure 10:
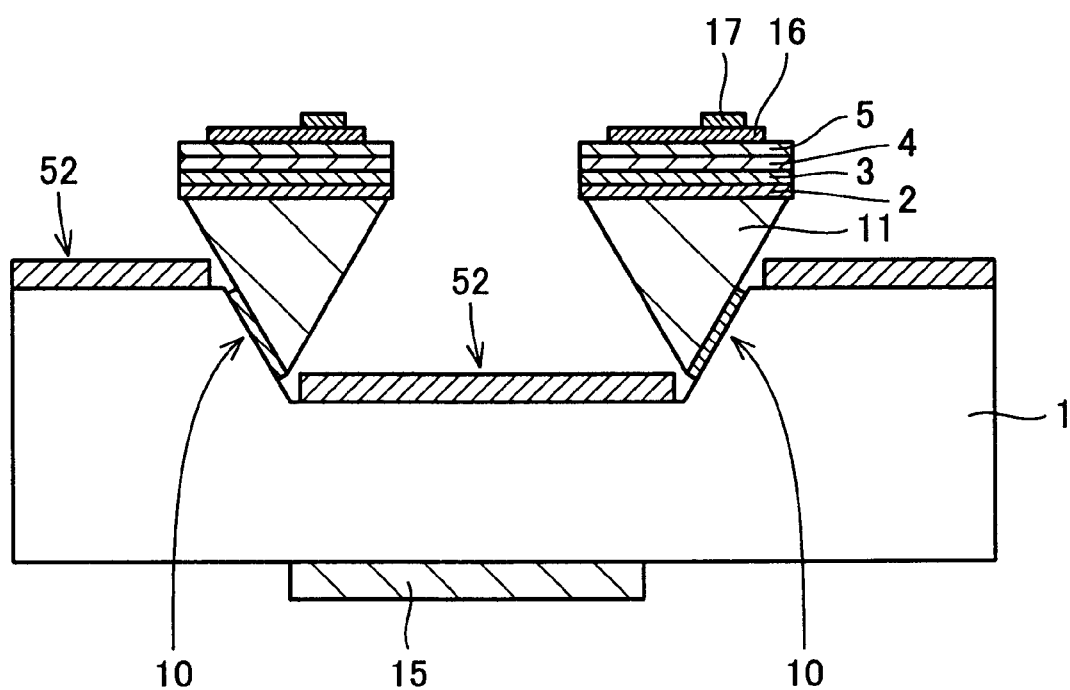
FIG. 10 is a sectional view of a semiconductor light emitting device of a seventh embodiment.

The previous first to fourth embodiments are based on a structure where a nitride semiconductor is grown only at one side slope of trenches provided in strips in an Si substrate. In the present seventh embodiment, the slopes of both sides are formed to have a predetermined off angle from the main plane. Each semiconductor light emitting device is formed at the Si slope of both sides in a manner similar to that of the sixth embodiment, as shown in FIG. 10.

The description of the above embodiments is based on a semiconductor light emitting device which is an LED as the semiconductor device. The application of the present invention is not limited to such a device, and can be applied to a semiconductor laser device. The present invention can also be applied to a GaN type MESFET having an electrode of a source, drain and gate formed at a film produced by growing an Si doped GaN layer via a high resistance layer of an AlGaN layer using the above-described method. The present invention is further applicable to a GaN type MODFET that has the GaN channel layer subjected to Si modulation doping. Since the planarity of each layer can be improved therein, the abruptness of the channel layer interface can be increased to facilitate the mobility of electrons running in the channel layer by the uneven scattering. A semiconductor device of favorable electrical characteristics in the cutoff frequency can be obtained. Furthermore, since the conductivity between the Si substrate and the nitride semiconductor layer can be ensured, the device can be formed integrally on the Si substrate to allow fabrication of an integrated semiconductor device circuit.

Eighth Embodiment

An eighth embodiment of the present invention will be described with reference to FIG. 2. FIG. 2 is a sectional view of a nitride semiconductor light emitting device of the eighth embodiment.

The nitride semiconductor light emitting device of the present embodiment has a multilayered structure of an n-AlGaInN layer 10, a first clad layer 2 of n-GaInN, a light emitting layer 3 of $Ga_xIn_{1-x}N$, a carrier block layer 4 of p-AlGaInN, and a second clad layer 5 of p-GaInN sequentially stacked on a silicon(112) substrate 1.

An electrode 15 is provided at a bottom plane (back side) of silicon (112) plane substrate 1. A transparent electrode 16 is provided at the top surface of second clad layer 5. A bonding electrode 17 is provided on a portion of transparent electrode 16.

By altering the composition x of $Ga_xIn_{1-x}N$, the wavelength of the band is variable to emit light from ultraviolet to red in light emitting layer 3. The present embodiment employs a light emitting layer that emits light in blue. Here, the value of x is 0.82.

The resistance of p type second clad layer 5 doped with magnesium is high. Therefore, there is a possibility that the current density may not be uniform throughout light emitting layer 3 even if current, i.e., holes, are injected from just bonding electrode 17 to one end of second clad layer 5.

In review of this disadvantage, a thin-film transparent electrode 16 is provided between bonding electrode 17 and second clad layer 5, all over the entire area of second clad layer 5. Accordingly, more light can be output from this portion.

Electrode 15 formed on n type silicon (112) plane substrate 1 may include any metal of Al, Ti, Zr, Hf, V, and Nb. These metals are desirable from the standpoint of reducing contact resistance and driving voltage.

For transparent electrode 16 connected to p type GaN second clad layer 5, metal such as any of Ta, Co, Rh, Ni, Pd, Pt, Cu, Ag, and Au or ITO and the like having a thickness of not more than 20 nm is preferably employed. Accordingly, the adherence is improved to allow reduction of the contact resistance and driving voltage.

A method of fabricating a nitride semiconductor light emitting device of the present embodiment will be described hereinafter.

Silicon (112) plane substrate 1 is rinsed and placed in a MOCVD. Cleaning is effected in a hydrogen ($H_2$) atmosphere at the high temperature of approximately 1100° C.

The (112) plane is employed for the main plane of silicon substrate 1. According to the experiment carried out by the inventors, a planer nitride semiconductor layer is obtained with respect to a plane inclined within the range of approximately ±5 degrees in all directions.

Then, at the temperature of 800° C., $NH_3$, trimethyl aluminium (TMA), trimethyl indium (TMI) and $SiH_4$ gas are introduced at 5 l/min., 10 $\mu$mol/min., 17 $\mu$mol/min., and 0.1 $\mu$mol/min., respectively, while introducing $N_2$ at 10 l/min. as carrier gas to form an $Al_{0.85}In_{0.15}N$ layer 10 of approximately 10 nm in thickness.

In the present embodiment, an AlInN intermediate layer is employed. A similar result can be obtained by using an intermediate layer of AlN, AlGaN, or AlGaInN.

Then, at the same temperature, supply of TMA is stopped, and trimethyl gallium (TMG), TMI, and $SiH_4$ gas are introduced at 20 $\mu$mol/min., 100 $\mu$mol/min., and 0.05 $\mu$mol/min., respectively, to grow a first clad layer 2 of silicon-doped $Ga_{0.92}In_{0.08}N$ to a thickness of approximately 300 nm.

Following deposition of an intermediate layer 10 of AlInN, the growth temperature for first clad layer 2 can be increased to result in an GaN film. Alternatively, by using an GaInN clad layer that includes In and does not include Al, growth at low temperature is allowed and generation of cracks can be suppressed.

Then, supply of TMA, TMI and TMG is stopped. The temperature of the substrate is lowered to 760° C. Trimethyl indium (TMI) that is the indium material is introduced at 6.5 $\mu$mol/min., and TMG is introduced at 2.8 mol/min., whereby a layer of $Ga_{0.82}In_{0.18}N$ is grown to the thickness of 3 nm to form a well layer.

Then, the temperature is raised again up to 850° C., and TMG is introduced at 14 $\mu$mol/min. to grow a barrier layer of GaN. In a similar manner, the growth of the well layer and the barrier layer is repeated to produce a light emitting layer 3 of a multiple quantum well (MQW) of 4 pairs.

Following the completion of the growth of light emitting layer 3, TMG, TMA, TMI, and biscyclo pentadienyl magnesium (Cp$_2$Mg) which is a p type doping source gas are introduced at 11 µmol/min., 1.1 µmol/min., 40 µmol/min. and 10 µmol/min., respectively, to grow a p type carrier block layer 4 of Al$_{0.20}$Ga$_{0.75}$In$_{0.05}$N to a thickness of 50 nm at a temperature identical to that of the last barrier layer.

At the end of the growth of carrier block layer 4, supply of TMA is stopped, and p type second clad layer 5 of Ga$_{0.9}$In$_{0.1}$N is grown to a thickness of 80 nm at the same growth temperature. This completes the growth of the light emitting device structure. When the growth ends, supply of TMG, TMI and Cp$_2$Mg is stopped and the temperature is lowered to room temperature. The light emitting device structure is output from the MOCVD apparatus.

Then, a transparent electrode 16 is formed at the top surface of second clad layer 5, and a bonding electrode 17 is formed on a portion of transparent electrode 16. Electrode 15 is formed at the bottom plane of silicon (112) plane substrate 1. Thus, the light emitting device of the present embodiment is completed.

The characteristics of the above-produced semiconductor device were measured. The usage of a silicon (112) plane substrate 1 allows the formation of a planer layer by the two dimensional growth due to the presence of many macrosteps at the silicon surface. Accordingly, the abruptness at the interface within the structure is increased to reduce the leakage current that thus not contribute to light emission. The semiconductor device has a light emission of 3.0 mW with the forward current of 20 mA, exhibiting light emission higher than that of a conventional semiconductor device. Silicon (112) plane substrate 1 can be easily cut into the two directions of the axes of <11-2> and <1-10>. Therefore, a square LED chip can be fabricated, suppressed in chipping at the silicon end plane.

By using a plane inclined 62 degrees from the main plane of a silicon substrate, a plane corresponding to a silicon substrate (001) plane rotated 7.3 degrees about the [01-1] axis, or a plane inclined at the range within 3 degrees in an arbitrary direction from these planes as to a nitride semiconductor device formed on a silicon substrate in the present invention, an extremely planar crystal film of high quality with a (1-101) epitaxial plane can be obtained. By using this epitaxial plane, a semiconductor device having an abrupt interface and superior photoelectric characteristics can be provided.

Since a silicon substrate having la main plane formed of a plane in the range of ±5 degrees in an arbitrary direction from the (112) plane is employed, the silicon substrate can be easily cut in the two directions of the axes of <11-2> and <1-10>. Generation of chipping at the edge of a semiconductor device after being diced into chips can be suppressed effectively.

Since a planer nitride semiconductor layer can be formed on the main plane of the silicon substrate, a semiconductor device that has a light emitting intensity higher then that of a conventional semiconductor device can be provided.

Although the present invention has been described and illustrated ir detail, it is clearly understood that the same is by way of illustration and example only and is not to be taken by way of limitation, the spirit and scop( of the present invention being limited the terms of the appended claims.

What is claimed is:

1. A semiconductor device comprising a silicon substrate and a compound semiconductor layer formed on a main plane of said silicon substrate and represented by a general formula of In$_x$Ga$_y$Al$_z$N (where x+y+z=1, 0≦x≦1, 0≦y≦1, 0≦z≦1), wherein said silicon substrate includes a trench having as a slope a plane inclined 62 degrees from the main plane of said silicon substrate or a plane inclined at a range within 3 degrees in an arbitrary direction from the inclined plane, said compound semiconductor layer formed on said slope.

2. The semiconductor device according to claim 1, wherein a <0001> direction of said compound semiconductor layer is substantially perpendicular to said slope.

3. The semiconductor device according to claim 1, wherein said compound semiconductor layer has a (1-101) plane as a plane orientation.

4. A semiconductor device comprising a compound semiconductor layer represented by a general formula of In$_x$Ga$_y$Al$_z$N (where x+y+z=1, 0≦x≦1, 0y≦1, 0≦z≦1), wherein said compound semiconductor layer is formed using a silicon substrate having a main plane constituted by a plane corresponding to a (100) plane rotated 7.3 degrees about a [01-1] axis, or a plane in a range inclined within 3 degrees from the rotated plane in an arbitrary direction, said silicon substrate including a trench having a (111) plane as a slope, and said compound semiconductor layer formed on said slope, wherein the plane in a range inclined within 3 degrees from the rotated plane in an arbitrary direction is different from the (100) plane and the (111) plane.

5. The semiconductor device according to claim 4, wherein a <0001> direction of said compound semiconductor layer is substantially perpendicular to said slope.

6. The semiconductor device according to claim 4, wherein said compound semiconductor layer has a (1-101) plane as a planes orientation.

7. The semiconductor device according to claim 6, said semiconductor device being a semiconductor light emitting device having a light emitting layer, said compound semiconductor layer including said light emitting layer, wherein said light emitting layer has a (1-101) plane as a plane orientation.

8. A semiconductor device having a compound semiconductor layer represented by Al$_x$Ga$_y$In$_z$N (where x+y+z=1, 0≦x≦1, 0≦y≦1, 0z≦1), on a silicon substrate, wherein said silicon substrate has a main plane constituted by a plane in a range of 5 degrees in an arbitrary direction from a (112) plane, and includes said compound semiconductor layer on said main plane; and wherein the plane in the range of ±5 degrees in an arbitrary direction from a (112) plane is different from the (112) plane.

9. The semiconductor device according to claim 8, wherein said compound semiconductor layer is plane via an intermediate layer.

10. A semiconductor device comprising:

a silicon substrate having a main plane in a range of ±5 degrees in an arbitrary direction from a (112) plane, a compound semiconductor layer represented by Al$_x$Ga$_y$In$_z$N (where x+y+z=1, 0≦x≦1, 0≦y≦1, 0≦z≦1) stacked on said main plane, a first electrode formed on said compound semiconductor layer, and a second electrode formed at a back plane of said silicon substrate.

* * * * *

UNITED STATES PATENT AND TRADEMARK OFFICE
CERTIFICATE OF CORRECTION

PATENT NO.    : 6,635,901 B2                                              Page 1 of 1
DATED         : October 21, 2003
INVENTOR(S)   : Nobuhiko Sawaki et al.

It is certified that error appears in the above-identified patent and that said Letters Patent is hereby corrected as shown below:

<u>Title page, Item [54] and Column 1, line 2,</u>
Please replace "INGAAIN" with -- INGAALN --.

<u>Title page,</u>
Item [75], Inventors, please replace "Chikusanishijutaki," with -- Chikusanishijutaku, --.

Signed and Sealed this

Thirtieth Day of March, 2004

JON W. DUDAS
*Acting Director of the United States Patent and Trademark Office*